United States Patent
Chen et al.

(10) Patent No.: US 7,897,453 B2
(45) Date of Patent: Mar. 1, 2011

(54) DUAL INSULATING LAYER DIODE WITH ASYMMETRIC INTERFACE STATE AND METHOD OF FABRICATION

(75) Inventors: Xiying Chen, San Jose, CA (US); Deepak Chandra Sekar, Sunnyvale, CA (US); Mark Clark, Santa Clara, CA (US); Dat Nguyen, San Jose, CA (US); Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 70 days.

(21) Appl. No.: 12/336,410

(22) Filed: Dec. 16, 2008

(65) Prior Publication Data
US 2010/0148324 A1    Jun. 17, 2010

(51) Int. Cl.
*H01L 21/8234* (2006.01)
(52) U.S. Cl. ............... 438/237; 257/656; 257/4; 257/E29.331
(58) Field of Classification Search .............. None
See application file for complete search history.

(56) References Cited

U.S. PATENT DOCUMENTS

| | | | |
|---|---|---|---|
| 5,122,889 A | 6/1992 | Kaneko et al. | |
| 5,191,509 A | 3/1993 | Wen | |
| 5,272,370 A | 12/1993 | French | |
| 5,274,485 A | 12/1993 | Narita et al. | |
| 5,841,150 A | 11/1998 | Gonzalez et al. | |
| 6,025,220 A | 2/2000 | Sandhu | |
| 6,198,132 B1 | 3/2001 | Ishida et al. | |
| 6,307,324 B1 | 10/2001 | Hirano et al. | |

(Continued)

FOREIGN PATENT DOCUMENTS

EP    1892722 A1    2/2008

(Continued)

OTHER PUBLICATIONS

Jammy, et al., "Synthesis and Characterization of TiO2 Films for Deep Trench Capacitor Applications," Proceedings of the 2000 12th IEEE International Symposium on Ferroelectrics, Jul. 21, 2000, pp. 147-150.

(Continued)

*Primary Examiner*—Julio J Maldonado
*Assistant Examiner*—Shaka Scarlett
(74) *Attorney, Agent, or Firm*—Vierra Magen Marcus & DeNiro LLP

(57) ABSTRACT

An integrated circuit including vertically oriented diode structures between conductors and methods of fabricating the same are provided. The diode is a metal-insulator diode having a first metal layer, a first insulating layer, a second insulating layer and a second metal layer. At least one asymmetric interface state is provided at the intersection of at least two of the layers to increase the ratio of the diode's on-current to its reverse bias leakage current. In various examples, the asymmetric interface state is formed by a positive or negative sheet charge that alters the barrier height and/or electric field at one or more portions of the diode. Two-terminal devices such as passive element memory cells can utilize the diode as a steering element in series with a state change element. The devices can be formed using pillar structures at the intersections of upper and lower conductors.

39 Claims, 12 Drawing Sheets

U.S. PATENT DOCUMENTS

| | | |
|---|---|---|
| 6,331,944 B1 | 12/2001 | Monsma et al. |
| 6,333,550 B1 | 12/2001 | Martin et al. |
| 6,380,922 B1 | 4/2002 | Lynch et al. |
| 6,392,913 B1 | 5/2002 | Sandhu |
| 6,534,784 B2 | 3/2003 | Eliasson et al. |
| 6,563,185 B2 | 5/2003 | Moddel et al. |
| 6,873,543 B2 * | 3/2005 | Smith et al. ................. 365/158 |
| 6,944,052 B2 | 9/2005 | Subramanian et al. |
| 6,980,466 B2 | 12/2005 | Perner et al. |
| 6,984,561 B2 | 1/2006 | Herner et al. |
| 6,995,962 B2 | 2/2006 | Saito et al. |
| 7,022,572 B2 | 4/2006 | Scheuerlein et al. |
| 7,115,967 B2 | 10/2006 | Cleeves |
| 7,129,098 B2 | 10/2006 | Rizzo et al. |
| 7,135,696 B2 | 11/2006 | Karpov et al. |
| 7,173,275 B2 | 2/2007 | Estes et al. |
| 7,388,276 B2 | 6/2008 | Estes |
| 7,615,439 B1 | 11/2009 | Schricker et al. |
| 2002/0171078 A1 * | 11/2002 | Eliasson et al. ............... 257/25 |
| 2004/0004268 A1 | 1/2004 | Brown et al. |
| 2004/0100817 A1 * | 5/2004 | Subramanian et al. ...... 365/158 |
| 2004/0113235 A1 | 6/2004 | Coolbaugh et al. |
| 2004/0159828 A1 | 8/2004 | Rinerson et al. |
| 2005/0083760 A1 | 4/2005 | Subramanian et al. |
| 2006/0267086 A1 | 11/2006 | Furukawa et al. |
| 2006/0267150 A1 | 11/2006 | Estes |
| 2006/0275983 A1 | 12/2006 | Thakur et al. |
| 2007/0069241 A1 | 3/2007 | Yang et al. |
| 2007/0120110 A1 | 5/2007 | Estes et al. |
| 2007/0241319 A1 | 10/2007 | Chang |
| 2007/0262415 A1 | 11/2007 | Smith et al. |
| 2008/0217732 A1 | 9/2008 | Kreupl |
| 2009/0026434 A1 | 1/2009 | Malhotra et al. |

FOREIGN PATENT DOCUMENTS

| | | |
|---|---|---|
| JP | 3045930 A | 2/1991 |
| JP | 3051823 A | 6/1991 |
| WO | WO 02/095832 A2 | 11/2002 |

OTHER PUBLICATIONS

Lu, et al., "Characteristics and Mechanism of Tunable Work Function Gate Electrodes Using a Bilayer Metal Structure on SiO2 and HfO2," IEEE Electron Device Letters, vol. 26, Issue 7, Jul. 2005, pp. 445-447.

Bae, et al., "Laminated Metal Gate Electrode With Tunable Work Function for Advanced CMOS," 2004 Symposium on VLSI Technology Digest of Technical Papers, Jun. 2004, pp. 188-189.

Rockwell, et al., "Characterization and Modeling of Metal/Double-Insulator/Metal Diodes for Millimeter Wave Wireless Receiver Applications," 2007 IEEE Radio Frequency Integrated Circuits Symposium, Jun. 2007, pp. 171-174.

Brown, Chappell, "Metal diode enables terahertz transceiver," EE Times, [http://www.eetimes.com/showArticle.jhtml?articleID=160502202], Apr. 11, 2005, 2 pages.

International Search Report & The Written Opinion of the International Searching Authority dated Jan. 29, 2010, Patent Cooperation Treaty, International Application No. PCT/US2009/058858 filed Sep. 29, 2009.

U.S. Appl. No. 12/240,785, filed Sep. 29, 2008.

U.S. Appl. No. 12/240,766, filed Sep. 29, 2008.

English translation of Abstract of Japanese Publication No. 3045930, published on Feb. 27, 1991.

English translation of Abstract of Japanese Publication No. 3051823, published on Jun. 3, 1991.

* cited by examiner

DUAL INSULATING LAYER DIODE WITH ASYMMETRIC INTERFACE STATE AND METHOD OF FABRICATION

BACKGROUND OF THE INVENTION

1. Field of the Invention

Embodiments in accordance with the present disclosure are directed to integrated circuits containing diodes.

2. Description of the Related Art

Materials having a detectable level of change in state, such as a resistance or phase change, are used to form various types of non-volatile semiconductor based memory devices. For example, simple antifuses are used for binary data storage in one time field-programmable (OTP) memory arrays by assigning a higher resistance initial physical state of a memory cell to a first logical state such as logical '0,' and assigning a lower resistance physical state of the cell to a second logical state such as logical '1.' Some materials can have their resistance switched back in the direction of their initial resistance. These types of materials can be used to form re-writable memory cells. Multiple levels of detectable resistance in materials can further be used to form multi-state devices which may or may not be re-writable.

Materials having a memory effect such as a detectable level of resistance are often placed in series with a steering element to form a memory cell. Diodes or other devices having a non-linear conduction current are typically used as the steering element. The memory effect of the cell is often referred to as the state change element. In many implementations, a set of word lines and bit lines are arranged in a substantially perpendicular configuration with a memory cell at the intersection of each word line and bit line. Two-terminal memory cells can be constructed at the intersections with one terminal (e.g., terminal portion of the cell or separate layer of the cell) in contact with the conductor forming the respective word line and another terminal in contactor with the conductor forming the respective bit line. Such cells are sometimes referred to as passive element memory cells.

Two-terminal memory cells with resistive state change elements have been used in three-dimensional field programmable non-volatile memory arrays because of their more simple design when compared to other three-terminal memory devices such as flash EEPROM. Three-dimensional non-volatile memory arrays are attractive because of their potential to greatly increase the number of memory cells that can be fabricated in a given wafer area. In three-dimensional memories, multiple levels of memory cells can be fabricated above a substrate, without intervening substrate layers.

Conventional semiconductor-based diodes such as p-i-n diodes have often been used in passive element memory arrays. As memory arrays are scaled down to provide larger amounts of storage in smaller areas, the abilities of p-i-n diodes to provide a sufficiently non-linear conduction current can become an issue. For example, the large depletion region in p-i-n diodes under reverse bias can result in a relatively high reverse leakage current. Such effects can limit the ability to scale the vertical thickness of these diodes. Moreover, the thermal budget associated with semiconductor-based diodes can cause undesired diffusion between the diode layers.

SUMMARY OF THE INVENTION

An integrated circuit including vertically oriented diode structures between conductors and methods of fabricating the same are provided. The diode is a metal-insulator diode having a first metal layer, a first insulating layer, a second insulating layer and a second metal layer. At least one asymmetric interface state is provided at the intersection of at least two of the layers to increase the ratio of the diode's on-current to its reverse bias leakage current. In various examples, the asymmetric interface state is formed by a positive or negative sheet charge that alters the barrier height and/or electric field at one or more portions of the diode. Two-terminal devices such as passive element memory cells can utilize the diode as a steering element in series with a state change element. The devices can be formed using pillar structures at the intersections of upper and lower conductors.

A metal-insulator diode according to one embodiment includes a first metal layer, a second metal layer separated from the first metal layer, a first insulating layer between the first metal layer and the second metal layer, and a second insulating layer between the first metal layer and the second metal layer. The first insulating layer is adjacent to the first metal layer and the second insulating layer is adjacent to the first insulating layer and the second metal layer. The second insulating layer includes an asymmetric interface state at an interface of the second insulating layer and the second metal layer. In one example where the second metal layer serves as the anode for the diode, the asymmetric interface state includes a positive charge at the interface of the second insulating layer and the second metal layer. In another example where the second metal layer serves as the cathode for the diode, the asymmetric interface state includes a negative charge at the interface of the second insulating layer and the second metal layer. In one example where the second metal layer serves as the anode, the asymmetric interface state is a first asymmetric interface state comprised of a positive charge and the first insulating layer includes a second asymmetric interface state with the first metal layer that is a negative charge.

A metal-insulator diode in accordance with another embodiment includes a first metal layer, a second metal layer separated from the first metal layer, a first insulating layer between the first metal layer and the second metal layer, and a second insulating layer between the first metal layer and the second metal layer. The first insulating layer is adjacent to the first metal layer and the second insulating layer is adjacent to the first insulating layer and the second metal layer. The second insulating layer has an asymmetric interface state at an interface of the second insulating layer and the first insulating layer. In one example, the asymmetric interface state is a positive charge. In another example, the asymmetric interface state is a negative charge.

A method of fabricating a metal-insulator diode is provided in one embodiment that includes forming a first metal layer over a substrate, forming a first insulating layer adjacent to the first metal layer, forming a second insulating layer adjacent to the first insulating layer, and forming a second metal layer adjacent to the second insulating layer. The first insulating layer has an interface with the first metal layer. The method includes forming an asymmetric interface state at the interface of the first metal layer and the first insulating layer.

In another embodiment, a method of fabricating a metal-insulator diode is provided that includes forming a first metal layer over a substrate, forming a first insulating layer adjacent to the first metal layer, forming a second insulating layer adjacent to the first insulating layer, and forming a second metal layer adjacent to the second insulating layer. The second insulating layer has an interface with the first insulating layer. The method includes forming an asymmetric interface state at the interface of the first insulating layer and the second insulating layer.

Other features, aspects, and objects of the disclosed technology can be obtained from a review of the specification, the figures, and the claims.

DETAILED DESCRIPTION

Figure 1A:
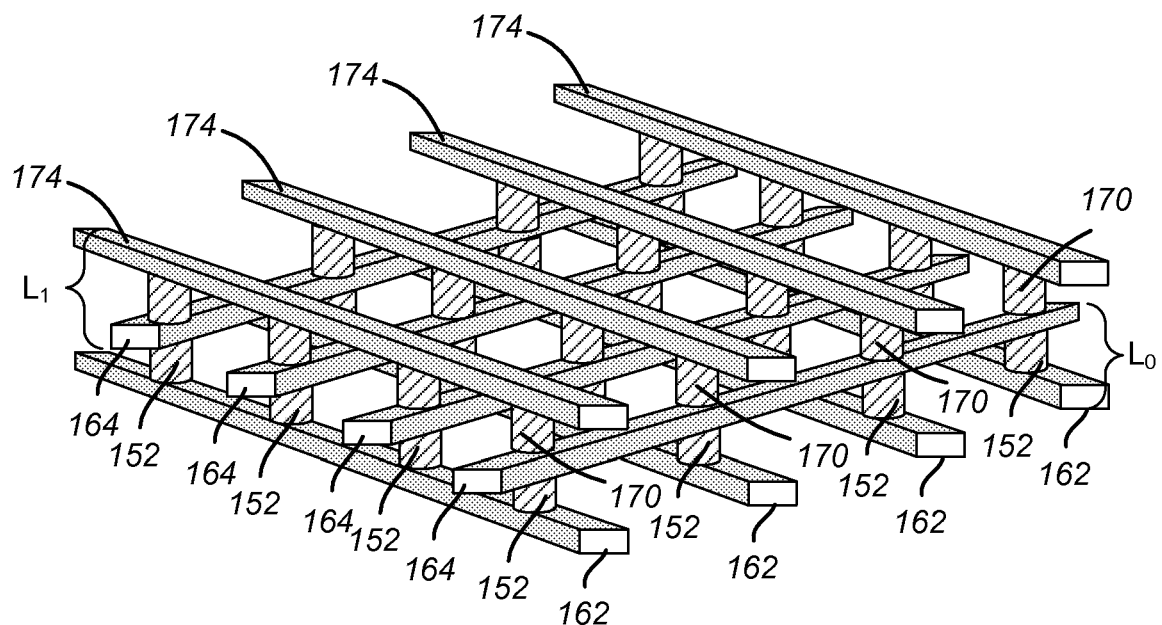
FIGS. 1A and 1B are perspective and cross-sectional views, respectively, of a three-dimensional memory array.
Figure 1B:
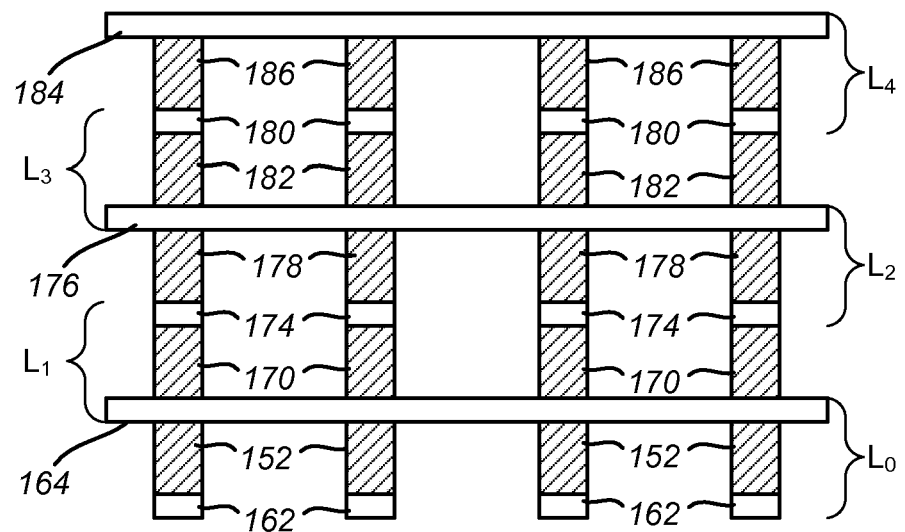

FIGS. 1A and 1B depict a portion of an exemplary monolithic three-dimensional memory array that can be implemented in accordance with embodiments of the present disclosure. A monolithic three dimensional memory array is one in which multiple memory levels are formed above a single substrate, such as a wafer, with no intervening substrates. Both the word line and bit line layers are shared between memory cells in the structure depicted in the perspective view of FIG. 1A. This configuration is often referred to as a fully mirrored structure. A plurality of substantially parallel and coplanar conductors form a first set of bit lines 162 at a first memory level L0. Memory cells 152 at level L0 include pillars formed between the bit lines and adjacent word lines 164. In the arrangement of FIGS. 1A-1B, word lines 164 are shared between memory layers L0 and L1 and thus, further connect to memory cells 170 at memory level L1. A third set of conductors form the bit lines 174 for these cells at level L1. These bit lines 174 are in turn shared between memory levels L1 and memory level L2, depicted in the cross-sectional view of FIG. 1B which shows additional memory levels. Memory cells 178 are connected to bit lines 174 and word lines 176 to form the third memory level L2, memory cells 182 are connected to word lines 176 and bit lines 180 to form the fourth memory level L3, and memory cells 186 are connected to bit lines 180 and word lines 184 to form the fifth memory level L5. The arrangement of the diodes' polarity and the respective arrangement of the word lines and bit lines can vary by embodiment. Additionally, more or less than five memory levels can be used. The diode steering elements for a given memory cell level in the embodiment of FIG. 1A can be formed upside down relative to the diodes of the previous memory cell level.

In an alternative embodiment, an inter-level dielectric can be formed between adjacent memory levels with no conductors being shared between memory levels. This type of structure for three-dimensional monolithic storage memory is often referred to as a non-mirrored structure. In some embodiments, adjacent memory levels that share conductors and adjacent memory levels that do not share conductors can be stacked in the same monolithic three dimensional memory array. In other embodiments, some conductors are shared while others are not. For example, only the word lines or only the bit lines can be shared in some configurations. A first memory level L0 can include memory cells between a bit line level BL0 and word line level WL0. The word lines at level WL0 can be shared to form cells at a memory level L1 that connect to a second bit line level BL1. The bit line layers are not shared so the next layer can include an interlayer dielectric to separate bit lines BL1 from the next level of conductors. This type of configuration is often referred to as half-mirrored. Memory levels need not all be formed having the same type of memory cell. If desired, memory levels using resistive change materials can alternate with memory levels using other types of memory cells, etc.

Figure 2:
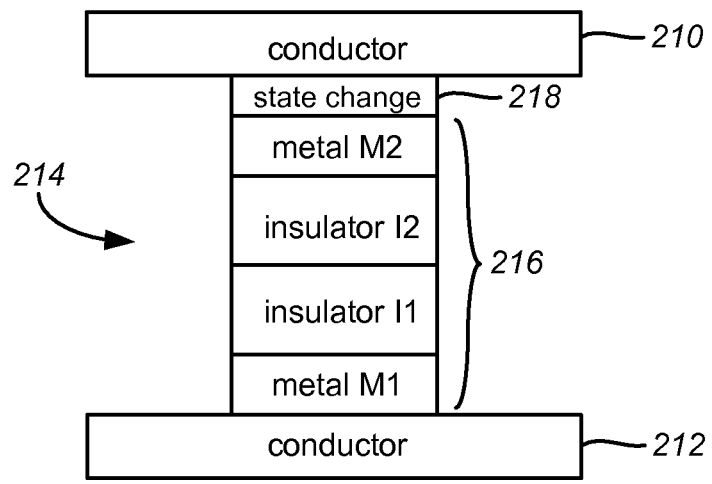
FIG. 2 depicts a two-terminal non-volatile memory cell having a MIIM diode steering element in series with a state change element.

FIG. 2 depicts an exemplary structure of a two-terminal non-volatile memory cell 214 in accordance with one embodiment that is formed at an intersection between upper and lower conductors, such as a bit line and a word line as shown in FIGS. 1A and 1B. A first terminal portion of the memory cell is connected to a first conductor 210 and a second terminal portion of the memory cell is connected to a second conductor 212. Conductor 210 can be a first array line (e.g., bit line) and conductor 212 can be a second array line (e.g., word line) or vice versa. The memory cell is formed using a pillar structure between the upper and lower conductors and includes a steering element 216 in series with a state change element 218 to provide non-volatile date storage. Although state change element 218 is located between the first conductor 210 and the steering element 216, the state change element 218 can be located between the second conductor and the steering element 216 in other embodiments.

A variety of materials exhibit resistivity change behavior suitable for implementing state change element 218. Examples of suitable materials include, but are not limited to, doped semiconductors (e.g., polycrystalline silicon, more commonly polysilicon), transition metal oxides, complex metal oxides, programmable metallization connections, phase change resistive elements, organic material variable resistors, carbon polymer films, doped chalcogenide glass, and Schottky barrier diodes containing mobile atoms that change resistance. State change elements formed from carbon can include any combination of amorphous and graphitic carbon. In one aspect, the carbon is deposited as a carbon film. However, it is not required that a carbon state change element be a carbon film. In one aspect, the state change element can include a carbon nanotube. One type of carbon nanotube stores a charge based on position of a "guest" molecule in the nanotube. The position of the guest molecule, which remains stable even without energy supplied to the memory cell, modifies the electric properties of the nanotube. One stable position of the guest molecule results in a high current, whereas the current is measurably lower in at least one other position. In one embodiment, the state change element 218 is $Ge_2Sb_2Te_5$ (GST). GST has a property of reversible phase change from crystalline to amorphous-allowing two levels per cell. However, quasi-amorphous and quasi-crystalline phases may also be used to allow additional levels per cell with GST. The resistivity of the aforementioned materials in some cases may only be set in a first direction (e.g., high to low), while in others, the resistivity may be set from a first level (e.g., higher resistance) to a second level (e.g., lower resistance), and then reset back to the first resistivity level.

In one embodiment, state change element 218 is an antifuse. An anti-fuse is manufactured in a high resistance state and can be popped or fused to a lower resistance state. An anti-fuse is typically non-conductive in its initial state and exhibits high conductivity with low resistance in its popped or fused state. Various types of antifuses can be used, including but not limited to dielectric rupture antifuses, intrinsic or lightly doped polycrystalline semiconductor antifuses and amorphous semiconductor antifuses, for example. Other types of two-terminal non-volatile memory cells can be used in accordance with embodiments of the present disclosure. For example, one embodiment includes an anti-fuse in addition to state change element 218 to provide further non-volatile storage capabilities. It is noted that an anti-fuse can provide benefits to the memory cell beyond its state change ability. An anti-fuse can serve to set the on-resistance of the memory cell at an appropriate level relative to the read-write circuitry associated with the cell. These circuits are typically used to pop the anti-fuse and have an associated resistance. Because these circuits drive the voltages and current levels to pop the anti-fuse, the anti-fuse tends to set the memory cell in an appropriate on-resistance state for these same circuits during later operations.

By assigning logical data values to the various levels of resistance that can be set and read from the state change element(s), non-volatile storage of data can be implemented in memory cell 214. A range of resistance values can be assigned to a physical data state to accommodate differences amongst devices as well as variations within devices after set and reset cycling. The terms set and reset are typically used, respectively, to refer to the process of changing an element from a high resistance physical state to a low resistance physical state (set) and changing an element from a low resistance physical state to a higher resistance physical state (reset). As a discreet device or element may have a resistance and different resistance states, the terms resistivity and resistivity state are used to refer to the properties of materials themselves. Thus, while a resistance change element or device may have resistance states, a resistivity change material may have resistivity states.

Steering element 216 is a metal-insulator-insulator-metal (MIIM) diode having a first metal layer M1, a first insulating layer I1, a second insulating layer I2 and a second metal layer M2. By way of non-limiting example, the metal layers can be formed of titanium nitride (TiN), titanium aluminum nitride (TiAlN), titanium silicon nitride (TiSiN), tantalum (Ta), tantalum nitride (TaN), hafnium nitride (HfN), or combinations of these materials. The metal layers serve as the electrodes (anode or cathode) of the diode. The insulating layers can vary by embodiment but generally include a low bandgap insulator and a high bandgap insulator. The terms low bandgap and high bandgap are relative and are used to refer to the low bandgap insulator having a smaller difference in energy between the top of its valence band and the bottom of its conduction band relative to the difference in energy between the top of the high bandgap insulator's valence band and the bottom of its conduction band. The low bandgap insulator can be formed of a higher dielectric constant material than the high bandgap insulator to reduce current leakage through the diode under reverse bias. By way of non-limiting example, the low bandgap insulator can be hafnium dioxide (HfO2) and the high bandgap insulator can be silicon dioxide (SiO2). Other materials that can be used for the insulating layers include, but are not limited to, lanthanum oxide (La2O3), aluminum oxide (Al2O3), silicon oxynitride (Si2OxNy), and hafnium silicate (HfSixOy). The low bandgap insulator is formed adjacent to the metal layer that serves as the anode and the high bandgap insulator is formed adjacent to the metal layer that serves as the cathode. For purposes of the following discussion, metal M1 is assumed to be the anode and metal M2 is assumed to be the cathode. In other embodiments, the designation of anode and cathode may be reversed.

Figure 3:
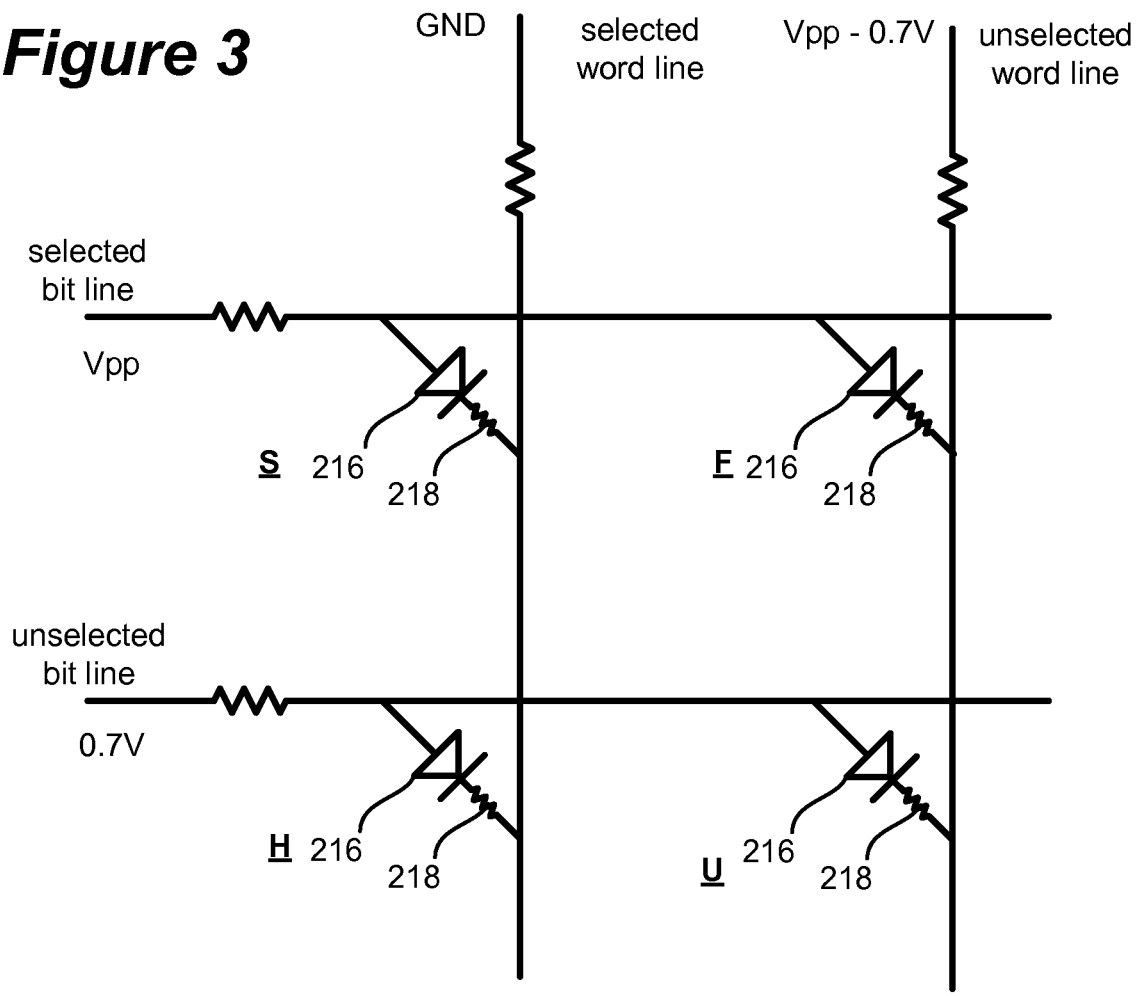
FIG. 3 is a circuit diagram depicting exemplary bias conditions for a memory array utilizing diode steering elements.

FIG. 3 is a circuit diagram of a portion of a non-volatile memory array incorporating memory cells 214. FIG. 3 also depicts an exemplary set of bias conditions for selecting memory cells during a set operation to switch memory cells to a low resistance state or a reset operation to switch memory cells to a high resistance state. In the described example, the steering elements 216 are arranged with their anode connected to a bit line conductor and their cathode connected to a word line conductor. The bit line conductors correspond to conductor 212 in FIG. 2 and the word line conductors correspond to conductor 210 in this example. In other examples, the polarity of the diodes with respect to the bit and word lines can be reversed and the bias conditions at the word and bit lines switched to maintain the same bias scenario across the memory cells. The selected bit line receives a voltage Vpp (e.g., 10V) while the selected word line is grounded. The unselected bit line receives a voltage of 0.7V while the unselected word line receives a voltage equal to Vpp-0.7V. These voltage levels are exemplary only and will vary in different implementations. Under the applied voltages, the selected memory cells (denoted S) are forward biased to permit a current flow to change the state of state change element 218. The unselected memory cells (denoted U) are reverse biased to inhibit a current flow therein. F denotes a half selected memory cell along a selected bit line and H denotes a half-selected memory cell along a selected word line, both of which are under a small forward bias. Similar biasing using lower voltage levels on the selected bit line and unselected word line may be used for reading a selected memory cell.

Figure 4A:
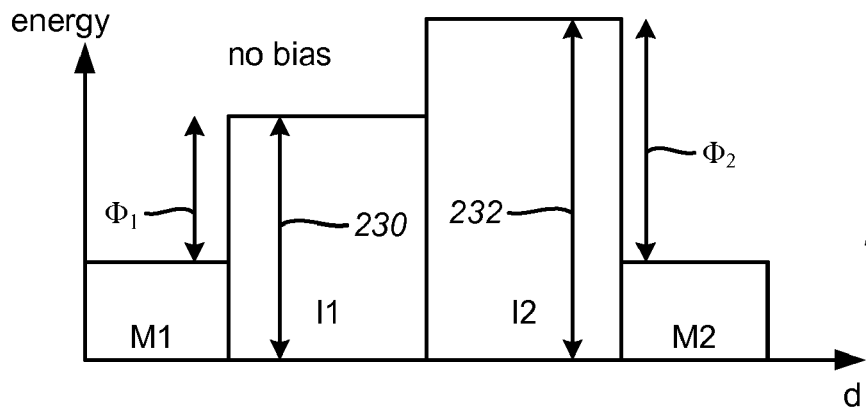
FIGS. 4A-4C are energy band diagrams for the MIIM diode steering element of FIG. 2.

FIG. 4A is an energy band diagram for diode 216 of FIG. 2. The energy band diagram depicts the height of the Fermi energy levels in metals M1 and M2 and the height of the conduction band edge in the insulators I1 and I2 along the y-axis as a function of distance (d) through the layers along the x-axis. FIG. 4A depicts the state of the diode when no bias is applied across the device. The bandgap of insulator I1 is shown by reference 230 and the bandgap of insulator I2 is shown by 232. Insulator I1 forms a barrier height $\Phi_1$ at the interface with metal M1 that is much smaller than the barrier height $\Phi_2$ formed at the interface of insulator I2 and metal M2.

Figure 4B:
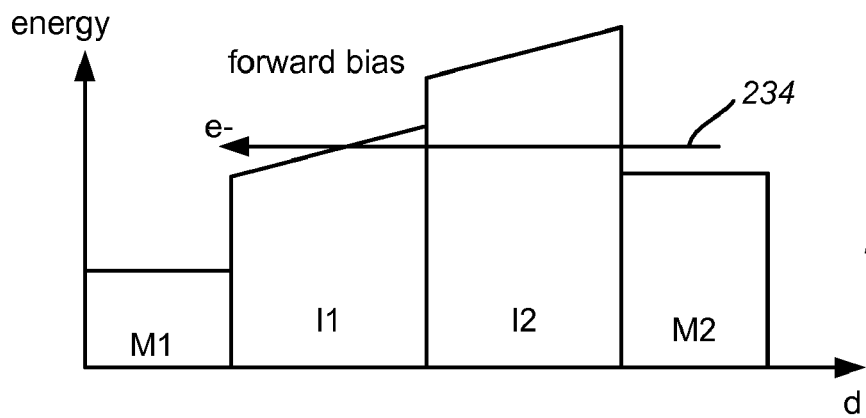

The use of low bandgap insulator I1 in series with high bandgap insulator I2 allows the diode to more readily conduct under forward bias than reverse bias. The ratio of the forward current of a diode under forward bias to the reverse or leakage current through the diode under reverse bias is referred to as the diode's rectification factor. FIG. 3B depicts the energy band diagram of diode 216 when subjected to a forward bias. For example, a selected memory cell S with the applied bias conditions shown in FIG. 2B may result in the energy band profile shown in FIG. 4B. Under forward bias, the energy level of metal M2 is raised to about the same level as the low band gap insulator I1. The low bandgap insulator does not present a large barrier to electron flow 234 in this scenario, while the high bandgap insulator I2 still presents a significant barrier to electron flow. Nevertheless, some electrons are able to tunnel through the barrier of the high bandgap insulator I2 via quantum mechanical tunneling. Once electrons reach the low bandgap insulator I1, there is little to no barrier to prevent them from reaching metal M1. Accordingly, a forward current (opposite direction to electron flow 234) is permitted through the diode under forward bias.

Figure 4C:
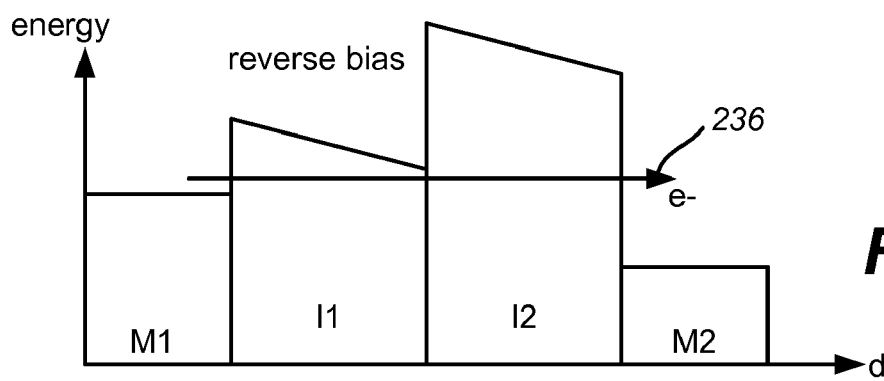

FIG. 4C depicts the energy band diagram of the MIIM diode under reverse bias. For example, an unselected memory cell U with the applied bias conditions shown in FIG. 3 may result in the energy band profile shown in FIG. 4C. In this condition, the applied voltage increases the energy level of metal M1 relative to metal M2. Under reverse bias, there remains a substantial barrier height or conduction band offset at the interface of metal M1 and the low bandgap insulator I1 that provides a barrier to electron flow 236 from metal M1. Moreover, the high band gap insulator I2 also provides a significant barrier to electron flow as the energy level of the insulator I2 is at or above the level of insulator I1. To reach metal M2, these electrons must tunnel through insulator I2 in addition to insulator I1. Accordingly, the reverse or leakage current (opposite direction to electron flow 236) through the diode is much smaller than the forward current under forward bias.

Figure 5:
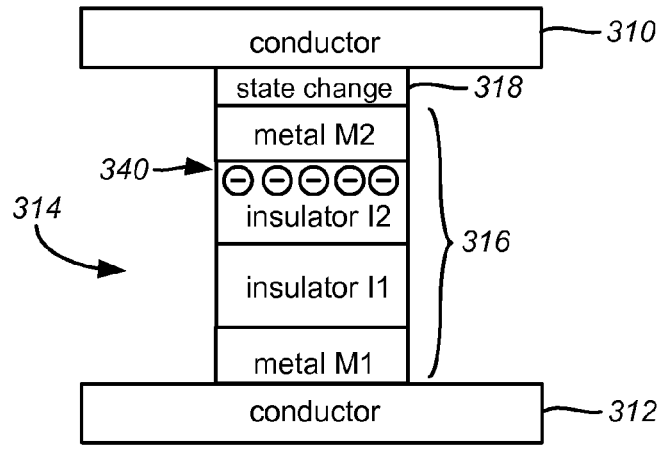
FIG. 5 depicts a two-terminal non-volatile memory cell including a state change element in series with a MIIM diode steering element having an asymmetric interface state between a first metal layer and a first insulating layer.

To further increase the rectification factor of an MIIM diode, embodiments in accordance with the present disclosure utilize one or more sheet charges at the interface of various layers of the diode. The sheet charges provide an asymmetric interface state between the layers that can affect the barrier height and/or electric field at various points in the diode to promote forward currents and/or inhibit revere currents. FIG. 5 depicts a two-terminal non-volatile storage element 314 in accordance with one embodiment that includes a negative sheet charge 340 to increase the forward current through the device. Storage element 314 includes a diode steering element 316 in series with a state change element 318 at the intersection of a first conductor 312 and a second conductor 310. Diode 316 is an MIIM diode formed from a first metal layer M1, a first insulator layer I1, a second insulator layer I2 and a second metal layer M2. The diode includes an asymmetric interface state between insulator I2 and metal M2 that results from the negative sheet charge 340 formed at the interface of the second insulator I2 and metal M2. The negative sheet charge 340 can be formed in insulator I2, metal M2 or a combination of the two layers.

Figure 6A:
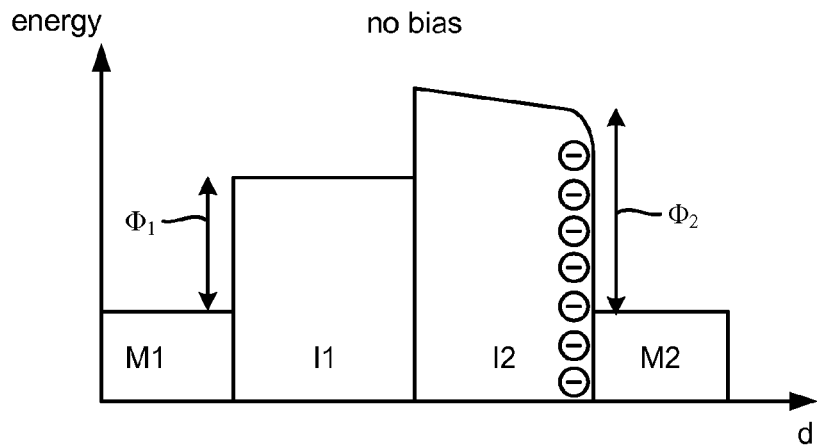
FIGS. 6A-6B are energy band diagrams for the MIIM diode steering element of FIG. 5.
Figure 6B:
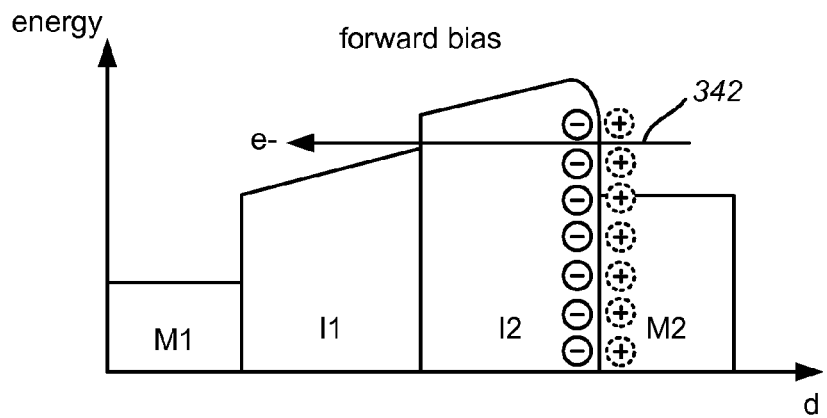

FIG. 6A is an energy band diagram of the diode 316 depicted in FIG. 5, illustrating the negative sheet charge 340 at insulator I2 and the resulting effects on the diode's energy band profile. FIG. 6A depicts the energy band profile of the diode at zero bias. The negative sheet charge lowers the effective barrier height $\Phi_2$ between insulator I2 and metal M2, thereby increasing the conduction current through the diode under forward bias. FIG. 6B depicts the energy band diagram of diode 316 when a forward bias is applied, e.g., by applying a positive voltage to metal M1 while grounding metal M2. The forward bias raises the energy level of metal M2 relative to metal M1 and facilitates quantum mechanical tunneling of electrons through the insulating layers as shown by arrow 342. The negative sheet charge at the interface of insulator I2 and metal M2 increases the ability of electrons to tunnel through the insulating layers by lowering the effective barrier height $\Phi_2$ between insulator I2 and metal M2. The fixed negative charge creates a corresponding imaging force represented by the dotted positive charge shown on the metal M2 side of the interface with insulator I2. The imaging force, which is in effect a balancing positive charge, attracts electrons from the metal layer, thus lowering the effective barrier height between insulator I2 and M2. The increased electron tunneling increases the on-current of the diode under forward bias.

Figure 7:
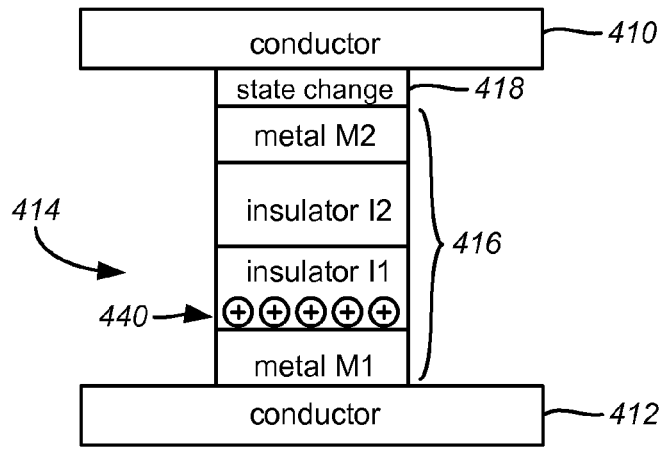
FIG. 7 depicts a two-terminal non-volatile memory cell including a state change element in series with a MIIM diode steering element having an asymmetric interface state between a second metal layer and a second insulating layer.

FIG. 7 depicts a two-terminal non-volatile storage element 414 in accordance with another embodiment having an asymmetric interface state that reduces leakage current through the steering element when reverse biased. As with the embodiment of FIG. 5, the steering element is a diode 416 formed in series with a state change element 418 at the intersection of a first conductor 412 and second conductor 410. Diode 416 includes a first metal layer M1, a first insulator layer I1, a second insulator layer I2 and a second metal layer M2. In the embodiment of FIG. 7, the asymmetric interface state includes a positive sheet charge 440 at the interface of the first insulator I1 and the first metal M1. The positive sheet charge 440 can be formed in insulator I1, metal M1 or a combination of the two layers. The positive sheet charge is designed to reduce electron tunneling through the diode when reverse biased and thus, decrease reverse leakage current through the diode.

Figure 8A:
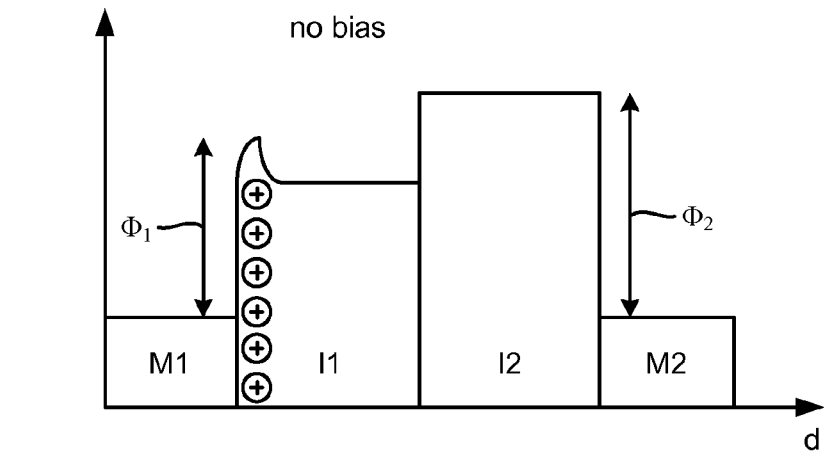
FIGS. 8A-8B are energy band diagrams for the MIIM diode steering element of FIG. 7.
Figure 8B:
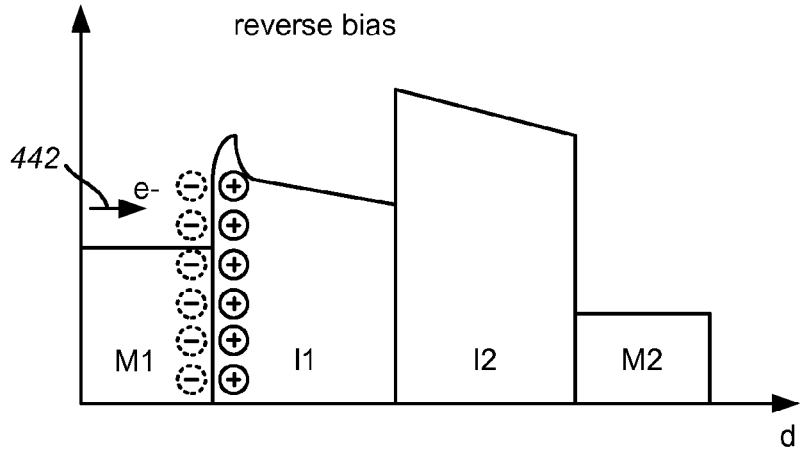

FIG. 8A depicts an energy band diagram of the diode 416 depicted in FIG. 7, illustrating the positive sheet charge 440 at insulator I1 and the resulting effects on the diode's energy band profile. In FIG. 8A, the diode is at zero bias. The positive charge raises the effective barrier height between insulator I1 and metal M1 at their interface to decrease the leakage current through the diode when reverse biased. FIG. 8B depicts the energy band diagram of diode 416 when a reverse bias is applied, e.g., by applying a positive voltage to metal M2 while grounding metal M1 or by applying a negative voltage to metal M1. The reverse bias raises the energy level of metal M1 relative to metal M2. The positive sheet charge at the interface of insulator I1 and metal M1 decreases the ability of electrons to tunnel through the insulating layers due to the increased effective barrier height. The positive charge creates a corresponding imaging force represented by the dotted negative charge shown on the metal M1 side of the interface with insulator I1. The imaging force, in effect a balancing negative charge to the positive charge, repels electrons from metal M1.

Figure 9:
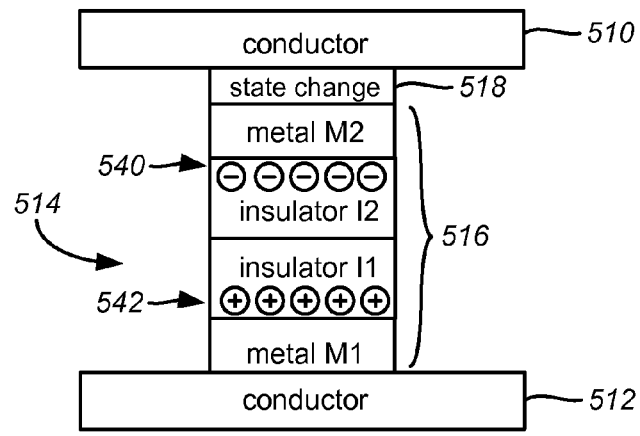
FIG. 9 depicts a two-terminal non-volatile memory cell including a state change element in series with a MIIM diode steering element having a first asymmetric interface state between a first insulating layer and a first metal layer and a second asymmetric interface state between a second insulating layer and a second metal layer.

FIG. 9 depicts another embodiment of a two-terminal non-volatile storage element 514 including a diode steering element 516 in series with a state change element 518. In this embodiment, two asymmetric interface states are created by combining the asymmetric interface states shown in FIGS. 5 and 7. A negative sheet charge 540 is formed in insulator I2 at the interface with metal M2 and a positive sheet charge 542 is formed in insulator I1 at the interface with metal M1. The negative charge reduces the effective barrier height between insulator I2 and metal M2 to increase the on-current of the device under forward bias, while the positive charge increases the effective barrier height between insulator I1 and M1 to decrease any leakage current through the device when subjected to a reverse bias.

Figure 10A:
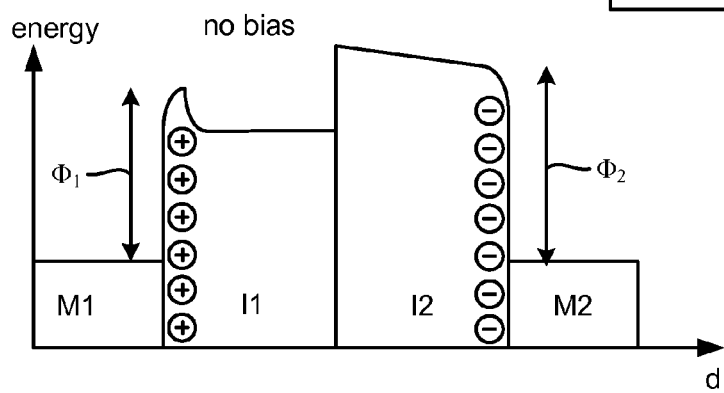
FIGS. 10A-10C are energy band diagrams for the MIIM diode steering element of FIG. 9.

FIG. 10A depicts an energy band diagram of the diode depicted in FIG. 9, illustrating the negative sheet charge 540, positive sheet charge 542 and the resulting effects on the diode's energy band profile. In FIG. 10A, the diode is at zero bias. The positive charge raises the effective barrier height $\Phi_1$ between insulator I1 and metal M1 and the negative charge lowers the effective barrier height $\Phi_2$ between insulator I2 and metal M2.

Figure 10B:
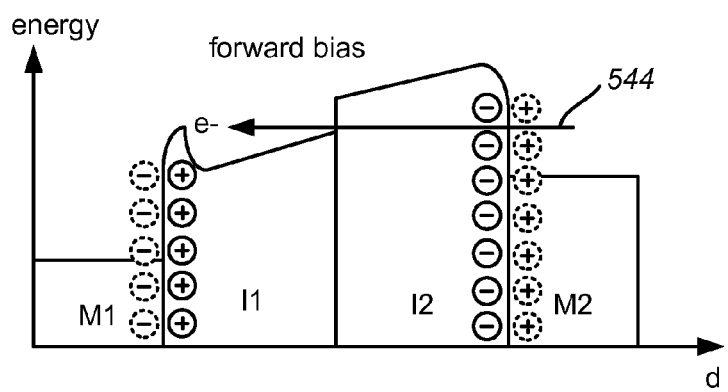
Figure 10C:
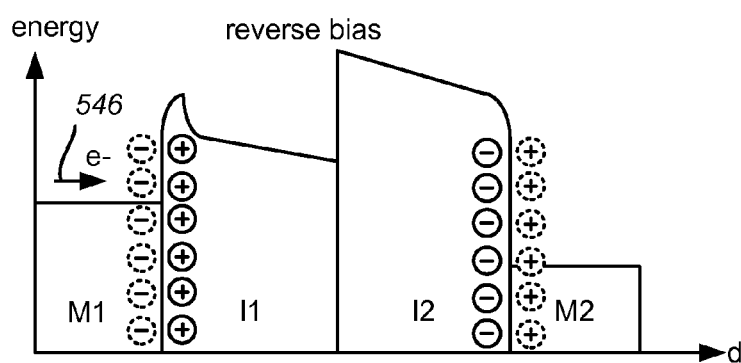

When a forward bias is applied across the diode, quantum mechanical tunneling of electrons through the insulating layers is facilitated as shown by arrow 544 in FIG. 10B. The negative sheet charge lowers the barrier height at the insulator/metal interface to increase the ability of electrons to tunnel through insulating layer I2. The imaging force represented by the dotted positive charges shown at the metal M2 side of the interface with insulator I2 attracts electrons from the metal layer, lowers the effective barrier height, and thereby increases the on-current of the diode under forward bias. When a reverse bias is applied as shown in FIG. 10C, the energy level of metal M1 is raised relative to metal M2. The positive sheet charge raises the effective barrier height between insulator I1 and metal M1 to decrease the ability of electrons to tunnel through insulating layer I1 as shown by arrow 546. The imaging force represented by the dotted negative charges shown at the metal M1 side of the interface with insulator I1 repels electrons from metal M1, raises the effective barrier height, and thereby decreases the reverse leakage current of the diode under reverse bias.

Figure 11:
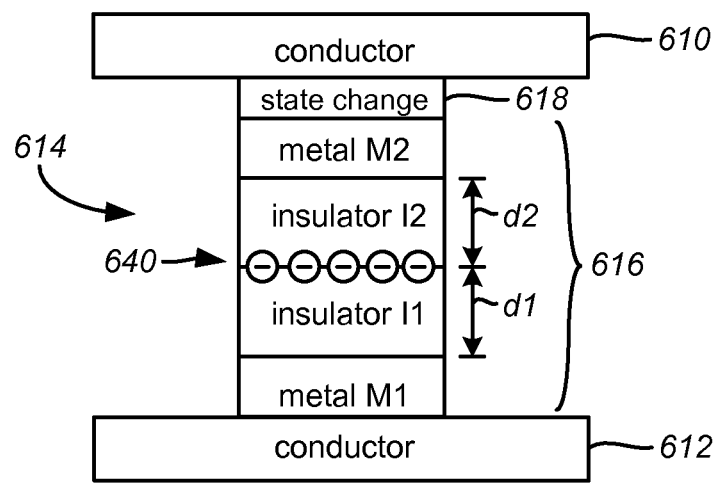
FIG. 11 depicts a two-terminal non-volatile memory cell including a state change element in series with a MIIM diode steering element having a negative charge asymmetric interface state between a first insulating layer and a second insulating layer.

The diodes depicted in FIGS. 5-10C each include an asymmetric interface state that serves to raise or lower the effective barrier height at portions of the diode in order to increase on-current and/or decrease leakage current through the diode. FIG. 11 depicts a diode in an embodiment that uses an asymmetric interface state to modify the electric fields across the insulating layers. By modifying the electric fields, improvements in the rectification factor of the diode can be made to improve on-current and/or decrease leakage current. In FIG. 11, diode 616 is again placed in series with a state change element 618 between two conductors 612 and 610. A negative sheet charge 640 is formed at the interface of insulator I1 and insulator I2. The negative charge is depicted along the interface between the insulating layers but can be formed within either or both of the insulating layers at their interface. The negative charge at the interface of the insulating layers will decrease the electrical field at the first insulating layer when the diode is reverse biased and will decrease the electrical field at the second insulating layer when the diode is forward biased. As demonstrated below, the amount of decrease in the electrical field at the first insulating layer under reverse bias is larger than the decrease in the electrical field at the second insulating layer under forward bias. This represents an increase in the rectification factor of the diode as the level of current through the diode under forward bias is decreased by a smaller amount than the leakage current through the diode under reverse bias.

The voltage $V_{total}$ and charge $\rho_s$ across the diode under forward bias are given by equation 1 and equation 2, where $E_1$ is the electric field across insulator I1, $d_1$ is the thickness of insulator I1, $\in_1$ is the permittivity of the first insulator I1 material, $E_2$ is the electric field across insulator I2, $d_2$ is the thickness of insulator I2 and $\in_2$ is the permittivity of the second insulator I2 material.

$$V_{total} = E_1 d_1 + E_2 d_2 \quad \text{equation 1}$$

$$\rho_s = \in_2 E_2 - \in_1 E_1 \quad \text{equation 2}$$

Equations 1 and 2 can be solved to determine the change in the electric field $\Delta E_2$ at the second insulator by the introduction of charge at the interface of the insulating layers. The change in electric field $\Delta E_2$ is given by equation 3.

$$\Delta E_2 = \frac{\rho_s d_1}{\varepsilon_2 d_1 + \varepsilon_1 d_2} \quad \text{equation 3}$$

The charge across the diode under reverse bias is given by equation 4.

$$\rho_s = \in_1 E_1 - \in_2 E \quad \text{equation 4}$$

Equations 1 and 4 can be solved to determine a change in electric field $\Delta E_1$ at the first insulator by the introduction of charge at the interface of the insulating layers. The change in electric field $\Delta E_1$ is given by equation 5.

$$\Delta E1 = \frac{\rho_s d_2}{\varepsilon_1 d_2 + \varepsilon_2 d_1} \quad \text{equation 5}$$

When the thickness $d_1$ of the first insulator is equal to the thickness $d_2$ of the second insulator as in FIG. 11, the negative charge at the interface of the insulating layers will decrease the electric field $E_1$ at the first insulator and the electric field $E_2$ at the second insulator by equal amounts. Because the electric field $E_2$ across the second insulator is greater than the electric field $E_1$ across the first insulator, the percentage of change in electric field $E_1$ will be greater than the percentage of change in electric field $E_2$. Equation 6 sets forth the ratio of the percentage of change in electric field $E_1$ to the percentage of change in electric field $E_2$. When the dielectric constant of insulator I1 is greater than the dielectric constant of insulator I2, the electrical field at the first insulator under reverse bias is reduced by a greater percentage than the electrical field at the second insulator under forward bias, thus causing an increase in the rectification factor of the diode.

$$\frac{\frac{\Delta E_1}{E_1}}{\frac{\Delta E_2}{E_2}} = \frac{\varepsilon_1 d_2}{\varepsilon_2 d_1} = \frac{\varepsilon_1}{\varepsilon_2} \quad \text{equation 6}$$

In one embodiment, the thickness $d_1$ of the first insulator is less than the thickness $d_2$ of the second insulator to further increase the rectification factor of the diode when a negative sheet charge is formed at the interface of the two insulating layers. Referring again to equation 3 and equation 4, the change in electric field $\Delta E_1$ across the first insulator at reverse bias is more than the change in electric field $\Delta E_2$ across the second insulator at forward bias when $d_1$ is less than $d_2$. The larger decrease in the electric field $E_1$ relative to the decrease in the electric field $E_2$ causes an increase in the rectification factor of the diode.

Figure 12:
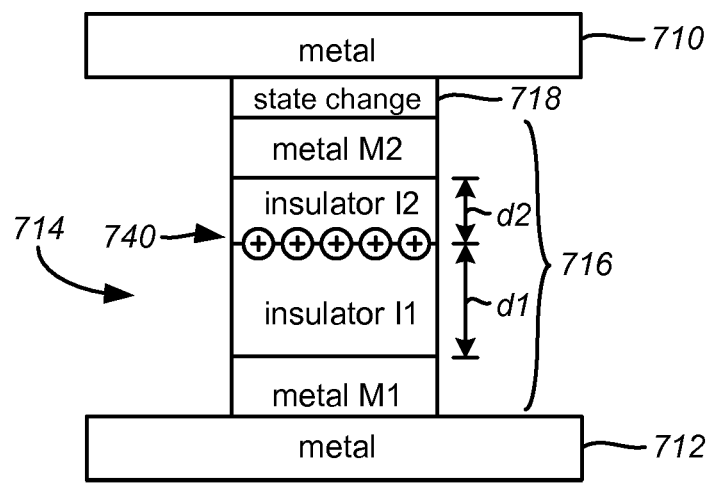
FIG. 12 depicts a two-terminal non-volatile memory cell including a state change element in series with a MIIM diode steering element having a positive charge asymmetric interface state between a first insulating layer and a second insulating layer.

FIG. 12 depicts a non-volatile storage element 714 in accordance with another embodiment that includes a positive sheet charge to create an asymmetric interface state. The storage element 714 includes a diode steering element 716 in series with a state change element 718 between a first conductor 712 and a second conductor 710. A positive sheet charge 740 is formed at the interface of the first insulator I1 and the second insulator I2 to increase the diode's rectification factor. The positive sheet charge can be formed in either or both of the first and second insulating layers. From equations 3 and 4 shown above, it is demonstrated that a positive sheet charge increases the electric field $E_1$ across the first insulator at reverse bias and the electric field $E_2$ across the second insulator at forward bias. By making the thickness $d_1$ of the first insulator greater than the thickness $d_2$ of the second insulator, the increase in electric filed $E_2$ at forward bias is larger than the increase in electric filed $E_1$ at reverse bias. By increasing the electric field $E_2$ at forward bias by a larger amount than electric filed $E_1$ at reverse bias, the rectification factor across the diode is increased.

In any of the previously described embodiments, the work functions of the metal layers can be tuned to further increase the rectification factor of the diode. For example, aluminum can be added to TiN to tune the work function of the metal. In one embodiment where the metal M1 layer serves as the anode, the metal M1 material can be tuned to have a work function that is higher than that of the metal M2 layer which serves as the cathode. By way of example, the metal M1 layer can be tuned to a work function of approximately 5 eV, while the work function of the metal M2 layer can be tuned to about 4 eV. If the metal M1 is to serve as the cathode, it can be tuned to about 4 eV while metal M2 is tuned to about 5 eV. Other work function tunings can be used in other implementations.

Figure 13A:
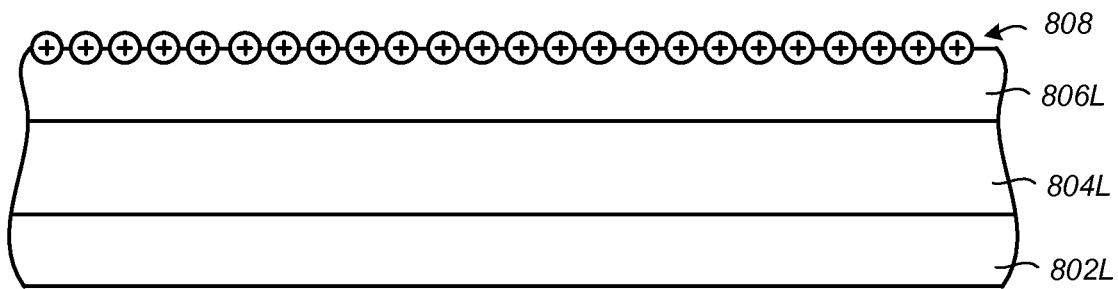
FIGS. 13A-13G are cross-sectional views depicting the fabrication of a portion of a non-volatile memory array in accordance with one embodiment of the disclosed technology.

FIGS. 13A-13G schematically illustrate the fabrication of a monolithic three-dimensional non-volatile memory array in accordance with one embodiment that includes two-terminal memory cells having an MIIM diode steering element with at least one asymmetric interface state. The described fabrication depicts the formation of a single memory level but it will be appreciated that one or more underlying memory levels may be formed prior to the memory level and that one or more overlying memory levels may be formed after the memory level. An insulating layer 802L is formed over a substrate or underlying memory level (not shown) as shown in FIG. 13A. The insulating layer can be formed using any suitable process such as chemical vapor deposition (CVD), physical vapor deposition (PVD) or atomic layer deposition (ALD). Suitable insulating materials include but are not limited to silicon dioxide, silicon nitride, high-K dielectric films, etc. Different thicknesses may be used as well, depending on implementation. The insulating layer may be omitted in embodiments that include a mirrored cell level arrangement when the described process is used to form an additional memory level over one or more underlying levels. The substrate can be any semiconductor substrate formed from materials such as monocrystalline silicon, IV-IV compounds, III-V compounds, II-VII compounds, etc. Epitaxial or other semiconductor layers may be formed over the substrate. It is noted that the substrate may have various integrated circuits formed therein, such as control circuitry for the memory levels formed above the substrate. An optional adhesion layer (not shown) can also be formed over the insulating material to help an overlying conducting layer to adhere. The adhesion layer can include, by way of non-limiting example, materials such as tantalum nitride, tungsten nitride, titanium tungsten, sputtered tungsten, titanium nitride or combinations of the same.

A layer 804L of conductive material is formed over insulating layer 802L using known processes such as CVD or PVD. The conducting layer can include any suitable conductive material known in the art, including but not limited to tantalum, titanium, tungsten, copper, cobalt or alloys thereof. In one embodiment, tungsten is deposited by CVD to a thickness of about 3000 A, although the thickness, material and process used can vary by embodiment. Layer 804L will be etched to form a first set of array lines, such as a set of bit lines or word lines. An optional adhesion layer (not shown) can be formed over the first conductive layer 804L to a thickness of about 100 A to aid in adhesion of the subsequently formed layers in one embodiment.

A metal layer 806L is formed over the first conductive layer 804L or optional adhesion layer. Metal layer 806L can be formed of any suitable metal as set forth above and include different thicknesses in different embodiment. In one example, the metal layer is TiN deposited to a depth of 100 A. Metal layer 804L will be etched to form a first set of electrodes for a set of diodes. A positive sheet charge 808 is then formed for creation of an asymmetric interface state with a subsequently formed insulating layer. Any suitable technique can be used for adding the positive sheet charge to metal layer 806L. In one embodiment, a forming gas such as $NH_3$ or $H_2$ is used to passivate metal layer 806L for the formation of the positive sheet charge. Different interface state densities can be formed in various embodiments. In one example, the interface state density resulting from the positive sheet charge is between $1\times10^{12}/cm^2$ and $1\times10^{14}/cm^2$. An annealing temperature between 450° C. to 650° C. can be used in one embodiment during the passivation, although other suitable temperatures can be used in other implementations. In another embodiment, the metal layer 806L can be doped heavily with P+ type impurities to create an abundance of positive charge carriers for the positive sheet charge.

Figure 13B:
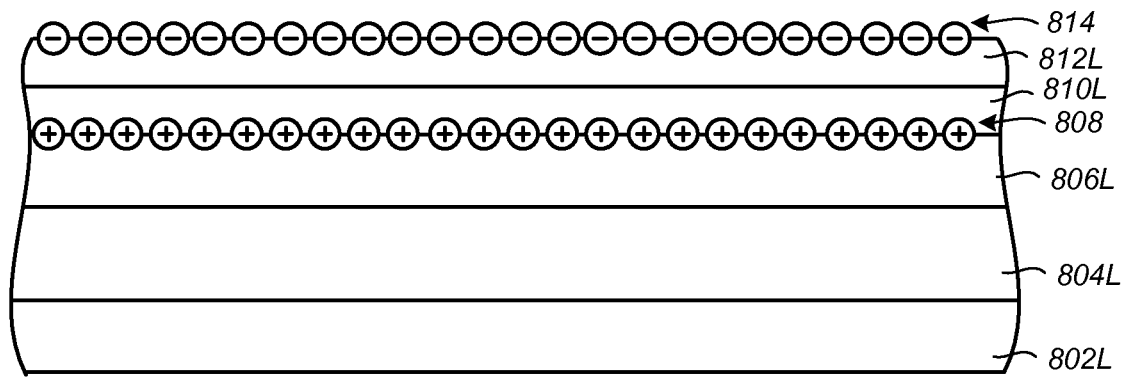

Over metal layer 806L is formed a first insulating layer 810L as shown in FIG. 13B. Over the first insulating layer 810L is formed a second insulating layer 812L. The two insulating layers are formed from different materials as earlier described and can vary by embodiment. The two insulating layers will be etched to form the dual insulating layers for the set of diodes. Generally, the first insulating layer 810L is selected to have a higher dielectric constant K and lower bandgap than the second insulating layer 812L. Exemplary materials include $HfO_2$ for the first insulator and $SiO_2$ for the second insulator. Other suitable materials include, but are not limited to, $Al_2O_3$ for the second insulator and $ZrO_2$, $Ta_2O_5$, $La_2O_3$ and $TiO_2$ for the first insulator. Different thicknesses of the insulating layers can be used. In one example, both insulating layers are deposited to a thickness of about 10 A. In another example, the first insulating layer is about 25 A and the second insulating layer is about 10 A.

After forming the second insulating layer, a second interface treatment is applied to introduce a negative sheet charge 814 at the interface with a subsequently formed second metal layer. Any suitable technique can be used for adding the negative sheet charge to the second insulating layer. In one embodiment, a forming gas such as $O_2$ or $Cl_2$ is used to passivate the second insulating layer for the formation of the negative sheet charge. Different interface state densities can be formed in various embodiments. In one example, the interface state density resulting from the negative sheet charge is between $1\times10^{12}/cm^2$ and $1\times10^{14}/cm^2$. An annealing temperature between 450° C. to 650° C. can be used in one embodiment during the passivation, although other suitable temperatures can be used. Instead of passivation, the second insulating layer can be doped heavily with N+ type impurities to create an abundance of negative charge carriers for the negative sheet charge in one embodiment.

Figure 13C:
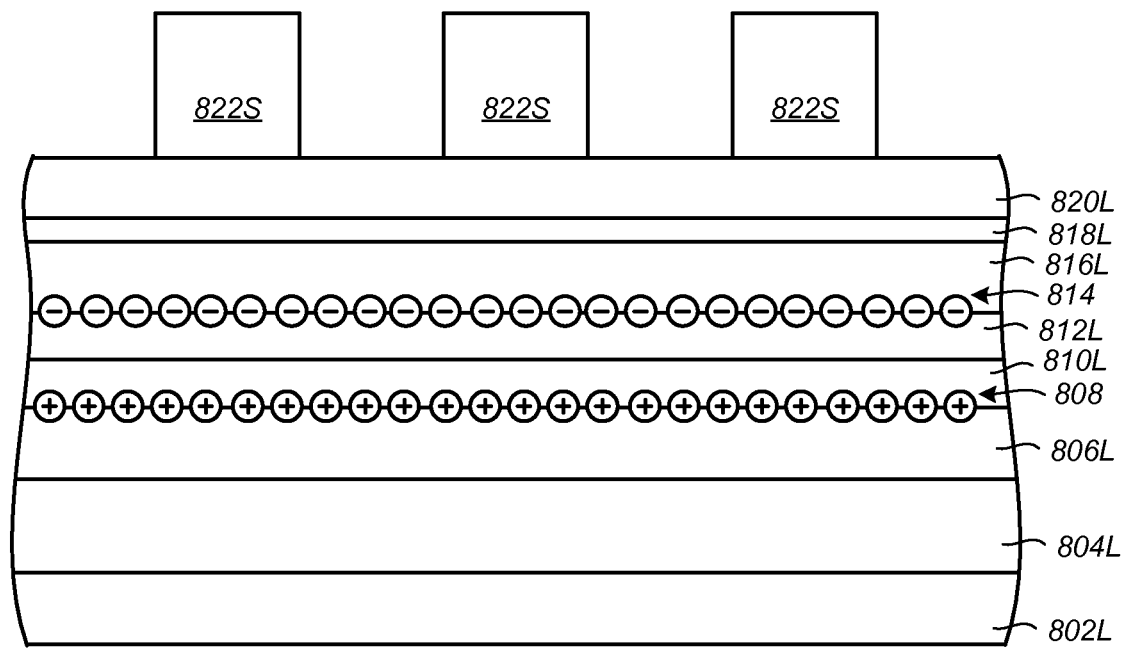

Following formation of the negative sheet charge 814, a second metal layer 816L is formed over the second insulating layer as shown in FIG. 13C. Metal layer 816L can be formed of any suitable metal, including but not limited to, TiN, etc. and can be different thicknesses in different embodiments. In one example, the second metal layer is formed to about 10 A. The first and second metal layers need not be formed of the same material. The second metal layer will be etched to form a second set of electrodes for the set of diodes. A state change element layer 818L is formed over the second metal layer. The state change element layer can include a layer of silicon dioxide to serve as an antifuse layer in one embodiment. In another embodiment, the state change element layer is a material capable of being reversibly switched between two or more states. In one exemplary embodiment, the state change element layer is deposited to a thickness of about 20-100 A. It is noted that the state change element layer can be formed below the first metal layer in one embodiment, rather than above the second metal layer as depicted in FIG. 13C.

A hard mask layer 820L is formed over state change element layer 818L. Any suitable hard mask material can be used, including but not limited to silicon nitride for example. Strips 822S of photoresist are then formed over the hard mask using conventional photolithography techniques. The strips of photoresist are elongated in a first direction over the hard mask with spaces between strips adjacent in a second direction that is substantially perpendicular to the first direction. Spacer-assisted patterning or nano-imprint technologies can also be used to form a pattern at less than the minimum definable feature size of the photolithography process being used in one embodiment.

Figure 13D:
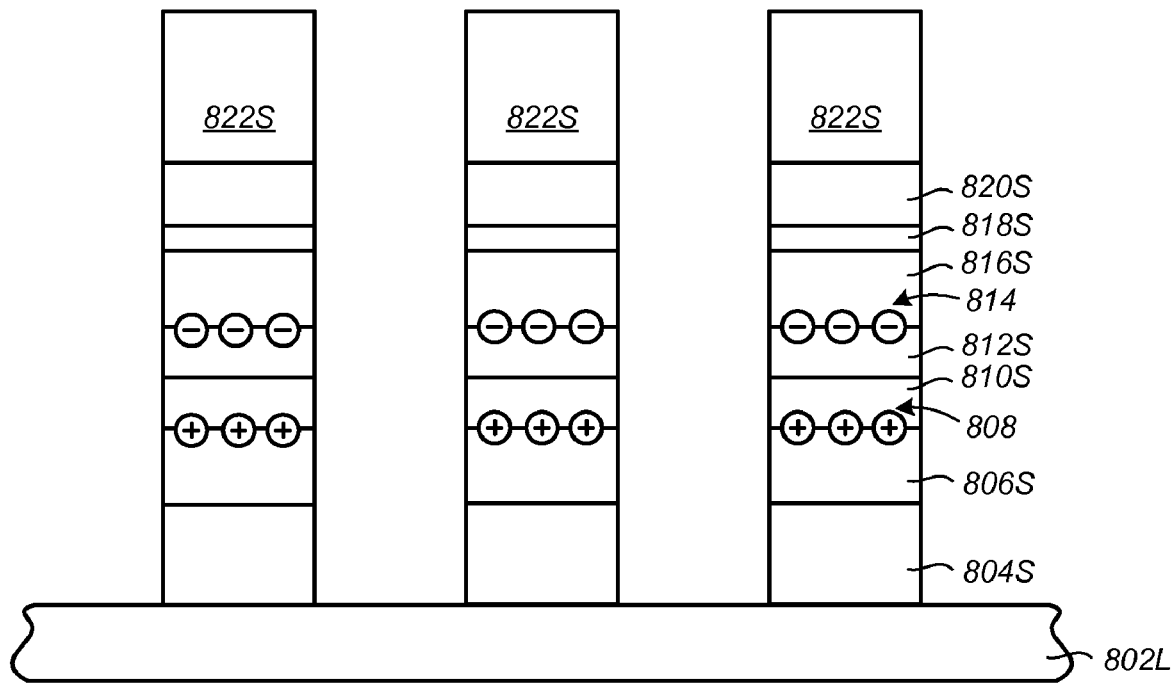

Using the photoresist as a pattern, the hard mask layer is etched, followed by etching through the underlying layers as depicted in FIG. 13D. Etching proceeds until insulating layer 802L is reached. Any suitable etching process or processes can be used. The layers are etched into strips that are elongated in the first direction with spaces between strips that are adjacent in the second direction. Etching the layer stack forms a first set of conductors 804S that are elongated in the first direction over the substrate. Layers 806L, 810L, 812L, 816L and 818L are each etched into strips 806S, 810S, 812S, 816S and 818S.

Figure 13E:
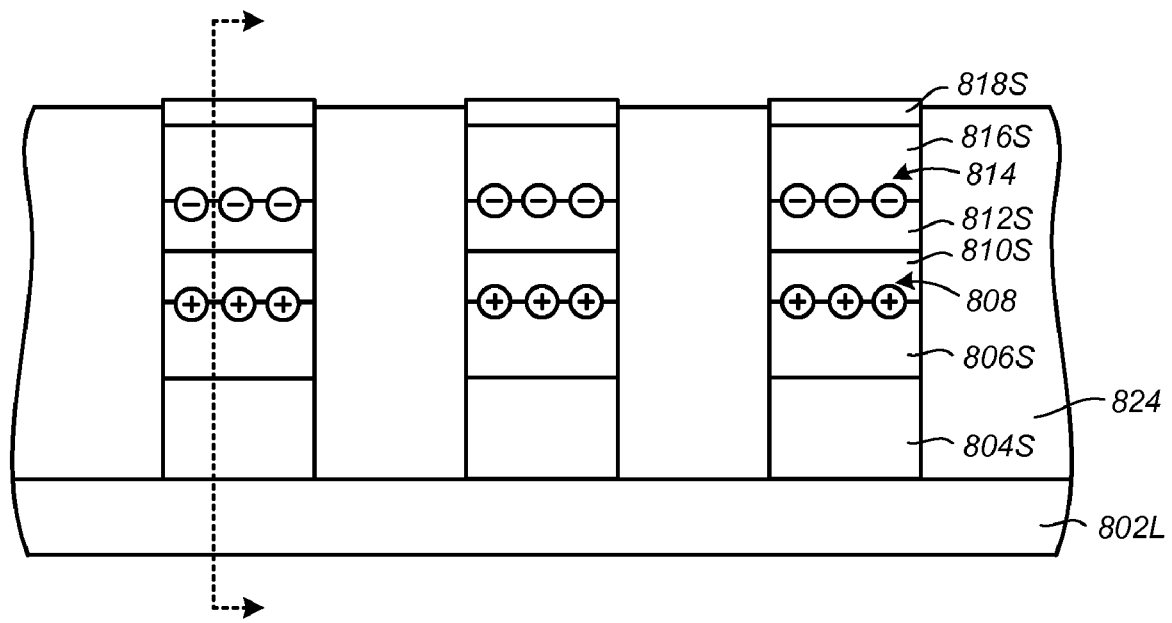

After etching to form the first set of conductors 804S, the strips of photoresist and hard mask are removed as shown in FIG. 13E. Conventional processes such as ashing in an oxygen-containing plasma can be used to remove the photoresist, followed by conventional processes such as a chemical wet etch to remove the hard mask layer. After removing the photoresist and hard mask, a dielectric material 824 is deposited over and between the strips. The dielectric material can be any suitable electrically insulating material such as silicon dioxide, silicon nitride or silicon oxynitride. Excess dielectric material is removed using conventional techniques such as chemical mechanical polishing. The dielectric layer is recessed just below the upper surface of strips 818S. In another example, a substantially planar surface is formed from strips 818S and the upper surface of the dielectric material separating the adjacent strips.

Figure 13F:
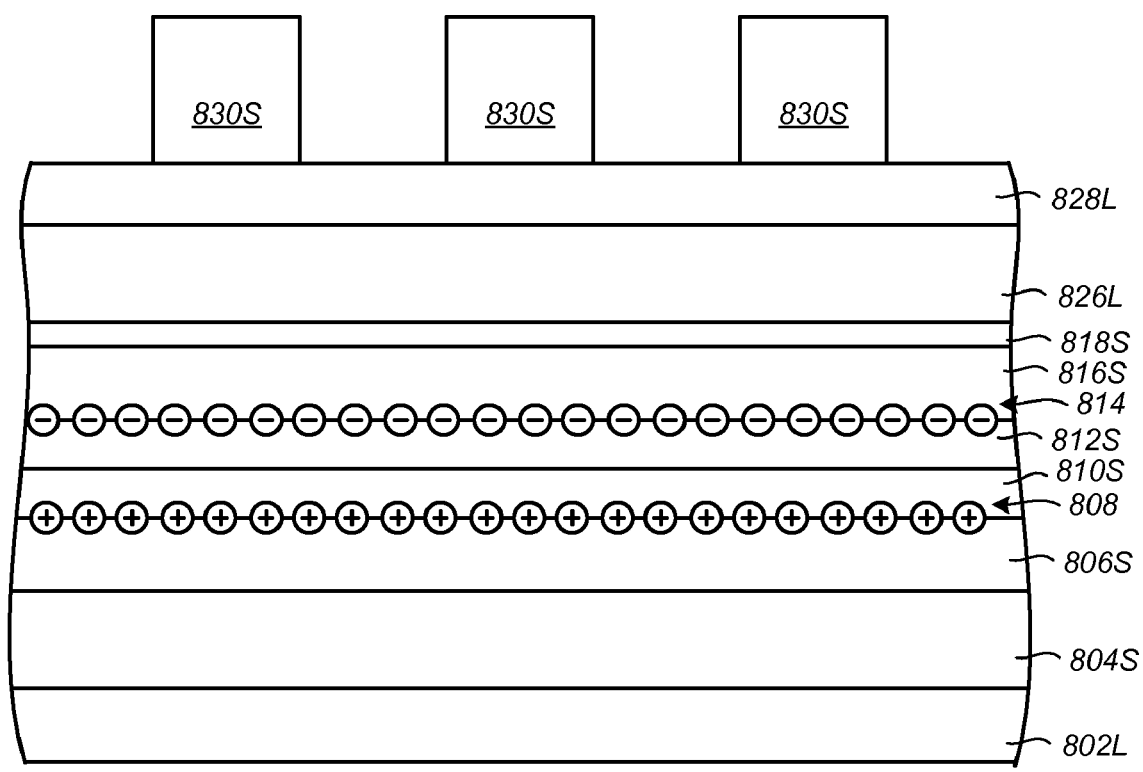

FIG. 13F is a cross-sectional view taken along line A-A in FIG. 13E showing a view through the array in the first direction. A first conductor strip 804S overlies insulating layer 802L, followed by a strip 806S of the first metal layer, a strip 810S of the first insulating layer, a strip 812S of the second insulating layer, a strip 816S of the second metal layer, and a strip 818S of the state change material. Over strip 818S of the state change material is then formed a second layer 826L of conductive material. The second layer of conductive material will be etched to form a second set of array lines. In one embodiment, the second conducting layer 836L is tungsten deposited by CVD or PVD to a thickness of about 3000 A. Other materials, processes and dimensions can be used as described with respect to first conducting layer 804L. A second hard mask layer 828L is formed over the state change element layer. Any suitable hard mask material can be used, including but not limited to silicon nitride for example. Strips 830S of photoresist are then formed over the hard mask using conventional photolithography techniques. The strips of photoresist are elongated in a second direction over the hard mask with spaces between strips adjacent in the first direction. Spacer-assisted patterning or nano-imprint technologies can also be used to form a pattern at less than the minimum definable feature size of the photolithography process being used in one embodiment.

Figure 13G:
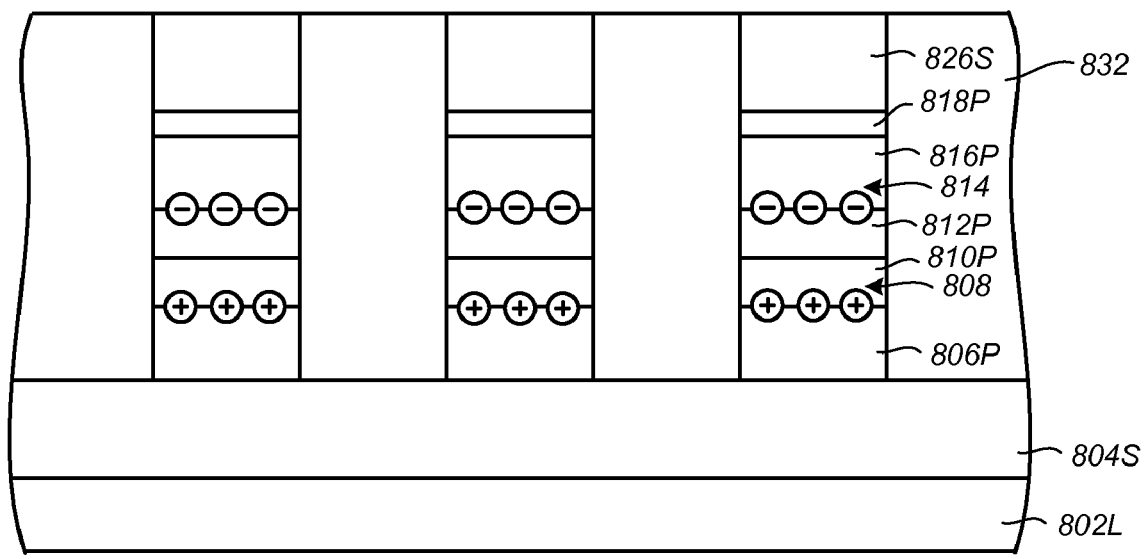

Using the photoresist as a pattern, the hard mask layer is etched, followed by etching through the underlying layers as depicted in FIG. 13G. Etching proceeds until the first conductive strip 804S is reached. Any suitable etching process or processes can be used. A selective etch process is used in one embodiment to etch through these layers while not etching the dielectric material 824 that was used to fill the spaces between the strips formed from the first etch process. Etching conductive layer 826L forms a second set of conductors 826S that are elongated in the second direction across the substrate with spaces therebetween in the first direction. Etching strips 818S, 816S, 812S, 810S, 806S forms a set of pillars between the first set of conductors 804S and the second set of conductors 826S. Each pillar includes a first metal portion 806P, a first insulating portion 810P, a second insulating portion 812P, a second metal portion 816P and a state change portion 818P. Layers 806P, 810P, 812P and 816P in each pillar form a diode steering element for a storage device and the state change layer 818P in each pillar forms thee state change element for the device.

Following etching, another layer 832 of dielectric material is deposited over and between the rail stacks and pillars. Any suitable electrically insulating material such as silicon oxide can be used. An additional dielectric layer can be formed over dielectric layer 832 to form an inter-level dielectric layer to isolate the just formed memory level from a subsequently formed memory level. In other embodiments, an inter-level dielectric layer is not formed so that conductors 826S, etc. can be shared by the next memory level in a mirrored or half-mirrored arrangement.

Figure 13H:
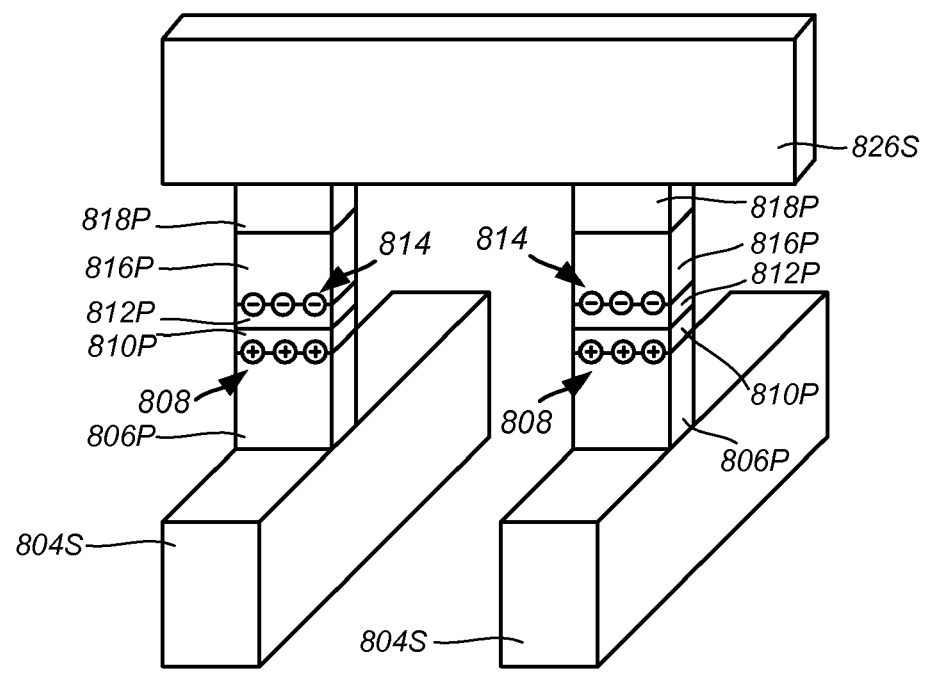
FIG. 13H is a perspective view of the portion of the non-volatile memory array fabricated as shown in FIGS. 13A-13G.

FIG. 13H is perspective view of a portion of the memory level fabricated as shown in FIGS. 13A-13G. The dielectric layers 824 and 832 have been omitted for clarity of the depiction. The first set of conductors 804S are elongated in a first direction orthogonal to a second direction of the second set of conductors 826S. Two memory element pillars are shown in FIG. 13H that are formed at the intersection of one of the second conductors 826S and a pair of the first conductors 804S. Each pillar includes a diode formed from layers 806P, 810P, 812P and 816P and a state change element formed from layer 818P.

The fabrication described in FIGS. 13A-13H forms a steering element with two asymmetric interface states, corresponding to the embodiment depicted in FIG. 9. By omitting the positive sheet charge 808 at the interface of the first metal layer 806L and the first insulating layer 810L, a device as depicted in FIG. 5 can be formed. Similarly, by omitting the negative sheet charge 814 at the interface of the second insulating layer 812L and the second metal layer 816L, a device as depicted in FIG. 7 can be formed. Both the negative sheet charge 814 and the positive sheet charge can be omitted to form devices as depicted in FIGS. 11 and 12. A negative sheet charge can be formed after depositing the first insulating layer 810L to form a device as depicted in FIG. 11. A positive sheet charge can be formed after depositing the first insulating layer 810L to form a device as depicted in FIG. 12.

Figure 14:
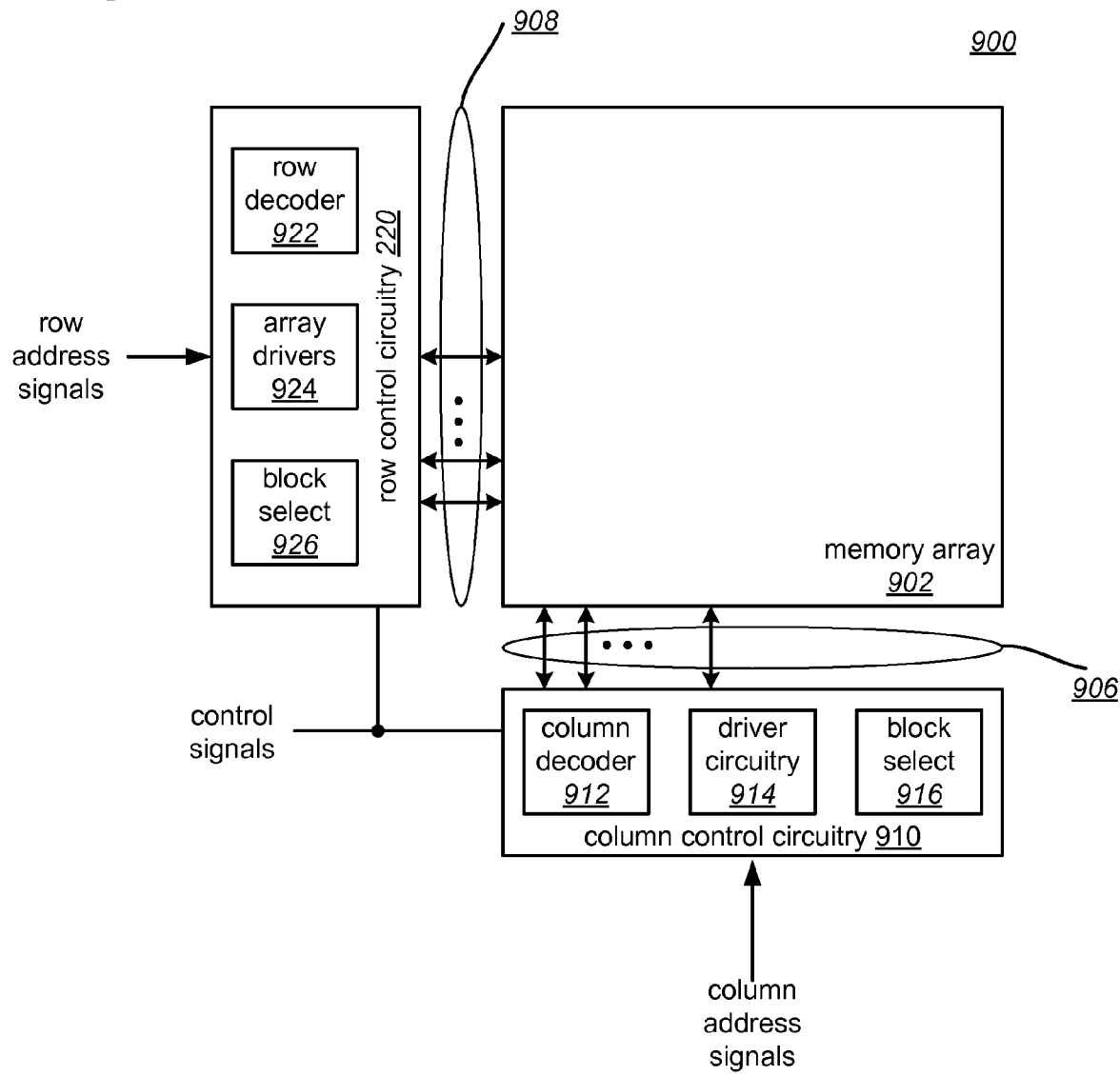
FIG. 14 is block diagram of a non-volatile memory system in accordance with one embodiment.

FIG. 14 is a block diagram of an exemplary integrated circuit including a memory array 902 that may include memory cells as earlier described. The array terminal lines of memory array 902 include the various layer(s) of word lines organized as rows, and the various layer(s) of bit lines organized as columns. The integrated circuit 900 includes row control circuitry 920 whose outputs 908 are connected to respective word lines of the memory array 902. The row control circuitry receives a group of M row address signals and one or more various control signals, and typically may include such circuits as row decoders 922, array terminal drivers 924, and block select circuitry 926 for both read and write (i.e., programming) operations. The integrated circuit 900 also includes column control circuitry 910 whose input/outputs 906 are connected to respective bit lines of the memory array 902. The column control circuitry 906 receives a group of N column address signals and one or more various control signals, and typically may include such circuits as column decoders 912, array terminal receivers or drivers 914, block select circuitry 916, as well as read/write circuitry, and I/O multiplexers. Circuits such as the row control circuitry 920 and the column control circuitry 910 may be collectively termed control circuitry or array terminal circuits for their connection to the various array terminals of the memory array 902.

The foregoing detailed description has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A metal-insulator diode, comprising:
a first metal layer;
a second metal layer separated from the first metal layer;
a first insulating layer between the first metal layer and the second metal layer, the first insulating layer adjacent to the first metal layer;
a second insulating layer between the first metal layer and the second metal layer, the second insulating layer adjacent to the first insulating layer and the second metal layer, the second insulating layer having an interface with the second metal layer; and
a positive fixed charge at the interface of the second insulating layer and the second metal layer.

2. A diode according to claim 1, wherein:
the first insulating layer has a first bandgap;
the second insulating layer has a second bandgap, the second bandgap is smaller than the first bandgap.

3. A diode according to claim 2, wherein:
the interface is a first interface; and
the first insulating layer has a second interface with the first metal layer; and
the diode further includes a negative fixed charge at the second interface.

4. A diode according to claim 2, wherein:
the first metal has a first work function; and
the second metal has a second work function, the second work function being larger than the first work function.

5. A diode according to claim 4, wherein:
the first insulating layer has a first thickness; and
the second insulating layer has a second thickness, the second thickness being greater than the first thickness.

6. A diode according to claim 2, wherein:
the first insulating layer has a first dielectric constant; and
the second insulating layer has a second dielectric constant, the second dielectric constant being higher than the first dielectric constant.

7. A diode according to claim 6, wherein:
the first insulating layer is SiO2; and
the second insulating layer is HfO2.

8. A metal-insulator diode, comprising:
a first metal layer;
a second metal layer separated from the first metal layer;
a first insulating layer between the first metal layer and the second metal layer, the first insulating layer adjacent to the first metal layer; and
a second insulating layer between the first metal layer and the second metal layer, the second insulating layer adjacent to the first insulating layer and the second metal layer, the second insulating layer having an interface with the second metal layer; and
a negative fixed charge at the interface of the second insulating layer and the second metal layer.

9. A diode according to claim 8, wherein:
the first insulating layer has a first bandgap; and
the second insulating layer has a second bandgap, the second bandgap is larger than the first bandgap.

10. A diode according to claim 8, wherein:
the first metal has a first work function; and
the second metal has a second work function, the second work function being smaller than the first work function.

11. A diode according to claim 10, wherein:
the first insulating layer has a first thickness; and
the second insulating layer has a second thickness, the second thickness being less than the first thickness.

12. A diode according to claim 1, wherein the diode is part of a three-dimensional monolithic non-volatile memory system, the memory system comprising:
a first plurality of conductors elongated in a first direction at a first height above a substrate;
a second plurality of conductors elongated in a second direction at a second height above the first plurality of conductors; and
a plurality of non-volatile storage elements formed between the first plurality of conductors and the second plurality of conductors, the plurality of non-volatile storage elements each including a steering element in series with a state change element.

13. A diode according to claim 12, wherein the state change element of each non-volatile storage element is a field-programmable re-writable state change element.

14. A diode according to claim 12, wherein the state change element of each non-volatile storage element is a one-time field-programmable state change element.

15. A diode according to claim 12, wherein:
the plurality of non-volatile storage elements is formed at a first memory level of the monolithic non-volatile memory system; and
the monolithic non-volatile memory system includes a plurality of additional memory levels.

16. A metal-insulator diode, comprising:
a first metal layer;
a second metal layer separated from the first metal layer;
a first insulating layer between the first metal layer and the second metal layer, the first insulating layer adjacent to the first metal layer;

a second insulating layer between the first metal layer and the second metal layer, the second insulating layer adjacent to the first insulating layer and the second metal layer, the second insulating layer having an interface with the first insulating layer; and a negative fixed charge at the interface of the second insulating layer and the first insulating layer.

17. A diode according to claim 16, wherein:
the first insulating layer has a first thickness and a first bandgap; and
the second insulating layer has a second thickness and a second bandgap, the first thickness being substantially equal to the second thickness, the first bandgap being lower than the second bandgap.

18. A diode according to claim 16, wherein:
the first insulating layer has a first thickness and a first bandgap; and
the second insulating layer has a second thickness and a second bandgap, the first thickness being less than the second thickness, the first bandgap being lower than the second bandgap.

19. A metal-insulator diode, comprising:
a first metal layer;
a second metal layer separated from the first metal layer;
a first insulating layer between the first metal layer and the second metal layer, the first insulating layer adjacent to the first metal layer;
a second insulating layer between the first metal layer and the second metal layer, the second insulating layer adjacent to the first insulating layer and the second metal layer, the second insulating layer having an interface with the first insulating layer; and
a positive fixed charge at the interface of the second insulating layer and the first insulating layer.

20. A method of fabricating a metal-insulator diode, the method comprising:
forming a first metal layer over a substrate;
forming a first insulating layer adjacent to the first metal layer, the first insulating layer having an interface with the first metal layer;
forming a second insulating layer adjacent to the first insulating layer;
forming a second metal layer adjacent to the second insulating layer; and
forming a positive fixed charge at the interface of the first metal layer and the first insulating layer.

21. A method according to claim 20, wherein:
the first insulating layer includes a lower bandgap than the second insulating layer.

22. A method according to claim 21, wherein:
the interface of the first metal layer and the first insulating layer is a first interface;
the method further comprising forming a negative fixed charge at a second interface of the second metal layer and the second insulating layer.

23. A method according to claim 21, wherein forming the positive fixed charge includes:
passivating at least one of the first metal layer and the first insulating layer to form the positive fixed charge at the interface of the first metal layer and the first insulating layer.

24. A method according to claim 21, wherein forming the positive fixed charge includes:
doping the first insulating layer to implant the positive fixed charge at the interface of the first metal layer and the first insulating layer.

25. A method of fabricating a metal-insulator diode, comprising:
forming a first metal layer over a substrate;
forming a first insulating layer adjacent to the first metal layer, the first insulating layer having an interface with the first metal layer;
forming a second insulating layer adjacent to the first insulating layer;
forming a second metal layer adjacent to the second insulating layer; and
forming a negative fixed charge at the interface of the first metal layer and the first insulating layer.

26. A method according to claim 25, wherein:
the first insulating layer includes a higher bandgap than the second insulating layer.

27. A method according to claim 20, wherein:
forming the second metal layer is performed prior to forming the second insulating layer, the first insulating layer and the first metal layer;
forming the second insulating layer includes forming the second insulating layer over the second metal layer;
forming the first insulating layer includes forming the first insulating layer over the second insulating layer; and
forming the first metal layer includes forming the first metal layer over the first insulating layer.

28. A method of fabricating a metal-insulator diode, the method comprising:
forming a first metal layer over a substrate;
forming a first insulating layer adjacent to the first metal layer;
forming a second insulating layer adjacent to the first insulating layer, the second insulating layer having an interface with the first insulating layer;
forming a second metal layer adjacent to the second insulating layer; and
forming a negative fixed charge at the interface of the first insulating layer and the second insulating layer.

29. A method according to claim 28, wherein forming the negative fixed charge includes:
passivating at least one of the first insulating layer and the second insulating layer to form the negative fixed charge at the interface of the first insulating layer and the second insulating layer.

30. A method according to claim 28, wherein forming the negative fixed charge includes:
doping at least one of the first insulating layer and the second insulating layer to form the negative fixed charge at the interface of the first insulating layer and the second insulating layer.

31. A method according to claim 28, wherein:
a thickness of the first insulating layer and a thickness of the second insulating layer are substantially equal.

32. A method according to claim 28, wherein:
the first insulating layer has a first bandgap and a first thickness; and
the second insulating layer has a second bandgap and a second thickness, the second bandgap being larger than the first bandgap, the second thickness being greater than the first thickness.

33. A method of fabricating a metal-insulator diode, the method comprising:
forming a first metal layer over a substrate;
forming a first insulating layer adjacent to the first metal layer;
forming a second insulating layer adjacent to the first insulating layer, the second insulating layer having an interface with the first insulating layer;

forming a second metal layer adjacent to the second insulating layer; and forming a positive fixed charge at the interface of the first insulating layer and the second insulating layer.

34. A method according to claim 33, wherein:

the first insulating layer has a first bandgap and a first thickness; and the second insulating layer has a second bandgap and a second thickness, the second bandgap being larger than the first bandgap, the second thickness being less than the first thickness.

35. A method according to claim 1, wherein the positive fixed charge is in the second metal layer.

36. A method according to claim 1, wherein the positive fixed charge is in the second insulating layer.

37. A method according to claim 1, wherein the positive fixed charge is in the second metal layer and the second insulating layer.

38. A method according to claim 16, wherein the negative fixed charge is in the first insulating layer.

39. A method according to claim 19, wherein:

the first insulating layer has a first thickness and a first bandgap; and the second insulating layer has a second thickness and a second bandgap, the first thickness being greater than the second thickness, the first bandgap being lower than the second bandgap.

* * * * *